United States Patent

Inoue et al.

[11] Patent Number: 6,096,582
[45] Date of Patent: Aug. 1, 2000

[54] METHOD OF MAKING A SEMICONDUCTOR DEVICE

[75] Inventors: Shunsuke Inoue, Yokohama; Mamoru Miyawaki, Isehara; Tetsunobu Kohchi, Hiratsuka, all of Japan

[73] Assignee: Canon Kabushiki Kaisha, Tokyo, Japan

[21] Appl. No.: 08/898,992

[22] Filed: Jul. 23, 1997

Related U.S. Application Data

[62] Division of application No. 08/745,872, Nov. 8, 1996, abandoned, which is a continuation of application No. 08/688,222, Jul. 29, 1996, abandoned, which is a continuation of application No. 08/474,326, Jun. 7, 1995, abandoned, which is a continuation of application No. 08/347,258, Nov. 23, 1994, abandoned, which is a continuation of application No. 08/194,640, Feb. 10, 1994, abandoned, which is a continuation of application No. 08/009,752, Jan. 27, 1993, abandoned.

[30] Foreign Application Priority Data

Jan. 28, 1992 [JP] Japan ................................ 4-35729
Jan. 31, 1992 [JP] Japan ................................ 4-40494

[51] Int. Cl.$^7$ .................................................. H01L 21/00
[52] U.S. Cl. ......................... 438/149; 438/151; 438/163; 438/164; 438/165; 438/166; 438/118; 438/459
[58] Field of Search ................................. 438/149, 459, 438/151, 163, 164, 165, 166, 118; 257/347, 350, 353, 351

[56] References Cited

U.S. PATENT DOCUMENTS

| | | | |
|---|---|---|---|
| 5,324,678 | 6/1994 | Kusunoki | 437/51 |
| 5,750,000 | 5/1998 | Yonehara et al. | 438/459 |
| 5,780,311 | 7/1998 | Beasom et al. | 438/406 |
| 5,840,616 | 11/1998 | Sakaguchi et al. | 438/459 |

FOREIGN PATENT DOCUMENTS

| | | |
|---|---|---|
| 0063915A2 | 11/1982 | European Pat. Off. . |
| 3108776 | 5/1991 | Japan . |

OTHER PUBLICATIONS

Patent Abstracts of Japan, vol. 005, No. 082 (E–059), May 29, 1981 & JP 56 –20370 A (Nippon Telegr & Teleph Corp.), Mar. 24, 1981.
Patent Abstracts of Japan, vol. 010, No. 313 (E–448), Oct. 24, 1986 & JP 61 125 163 A (Agency of Ind Science & Technol), Jun. 12, 1986.

*Primary Examiner*—John F. Niebling
*Assistant Examiner*—Lynne A. Gurley
*Attorney, Agent, or Firm*—Fitzpatrick, Cella, Harper & Scinto

[57] ABSTRACT

A method of making a semiconductor device is disclosed in which the device has an insulated gate transistor in which source and drain regions are provided in a single crystal semiconductor layer formed on an insulating layer with a channel region interposed between the source and drain regions. The insulating layers just below the source and drain regions are made thicker than an insulating layer just below the channel region. The method uses substrate bonding to achieve the device.

2 Claims, 7 Drawing Sheets

METHOD OF MAKING A SEMICONDUCTOR DEVICE

This application is a divisional of application Ser. No. 08/745,872 filed Nov. 8, 1996, now abandoned, which is a continuation of application Ser. No. 08/688,222 filed Jul. 29, 1996, abandoned, which is a continuation of application Ser. No. 08/474,326 filed Jun. 7, 1995, abandoned, which is a continuation of application Ser. No. 08/347,258 filed Nov. 23, 1994, abandoned, which is a continuation of application Ser. No. 08/194,640 filed Feb. 10, 1994, abandoned, which is a continuation of application Ser. No. 08/009,752 filed Jan. 27, 1993, abandoned.

BACKGROUND OF THE INVENTION

1. Field of the Invention

The present invention relates to a semiconductor device, more particularly a semiconductor device including an insulated gate transistor, and a manufacture method for such a semiconductor device.

2. Related Background Art

In recent years, semiconductor devices have become key devices for increasing performance of imaging devices such as image sensors and image displays.

As one example of semiconductor devices effective in improving a performance level, there is a transistor of the type that a semiconductor thin film on an insulating layer is used as an active region.

Forming single crystal Si as a semiconductor thin film on an insulating layer is widely known as a Silicon-On-Insulator (SOI) technique. A lot of studies have been focused on the SOI technique because devices utilizing it have many superior points which cannot be attained by bulk Si substrates used to manufacture ordinary Si integrated circuits. The SOI technique is practiced by, for instance, a method of condensing and irradiating an energy beam, such as an electron ray and a laser beam, onto an amorphous or polycrystal Si layer and growing a single crystal layer on $SiO_2$ by recrystallization through melt, or a method of forming an $SiO_2$ layer in a single crystal Si substrate by ion implantation of oxygen (called a SIMOX (Separation by Ion Implanted Oxygen) process).

Such a structure that a semiconductor thin film is formed on an insulating layer by using the SOI technique to suppress a short channel effect is proposed in, for instance, "Manufacture of very thin-film MOSFET/SIMOX with gate length of 0.15 μm and its characteristics", 1991 Autumn Congress of Japanese Electron Information Communication Society, SC-9-3. This paper describes that thinning the Si layer is effective in suppression of a short channel region effect and thinning a buried oxide film below the channel region is effective in suppression of a short channel effect upon the threshold voltage. It is also described that thinning the buried oxide film raises a problem of increasing parasitic capacity associated with source and drain regions.

Figure 1:
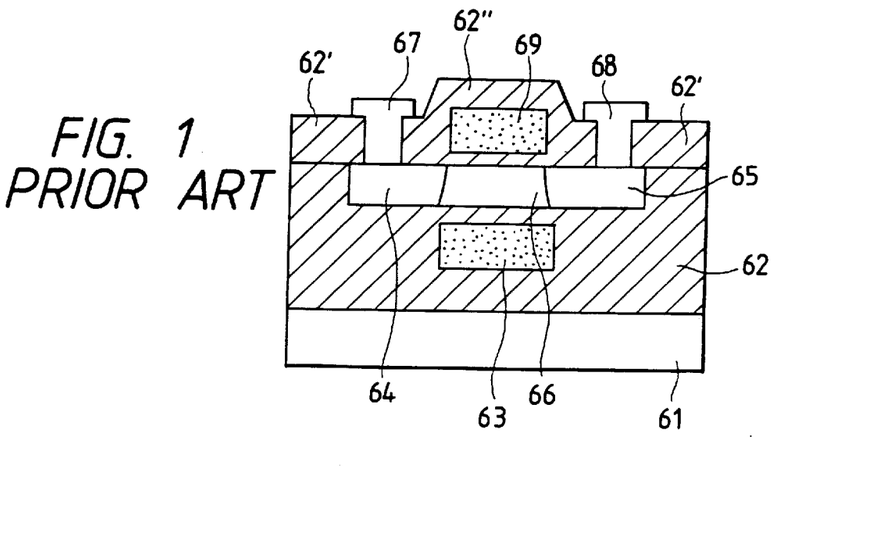
FIG. 1 is a schematic sectional view showing one example of a conventional semiconductor device.

Furthermore, a double gate MOS has recently been also developed which includes a second gate on the side opposite to a semiconductor layer, where source and drain regions are formed, and a usual gate with insulating layer therebetween. FIG. 1 shows one example of such a double gate MOS. Denoted by reference numeral 61 is a substrate, 62 to 62" are insulating layers, 63 is a second gate, 64 is a source region, and 65 is a drain region. A source electrode 67 and a drain electrode 68 are connected to the source region 64 and the drain region 65, respectively. A portion 66 sandwiched between the source region 64 and the drain region 65 is a channel portion, and 69 denotes a first gate for controlling the channel portion. It is known that the double gate MOS have advantages of improving a short channel effect and increasing a current driving force.

SUMMARY OF THE INVENTION

A first object of the present invention is to provide an insulated gate field effect transistor in which insulating layers just below source and drain regions can be made sufficiently thicker than an insulating layer just below a channel region, as well as a semiconductor device using such an insulated gate field effect transistor and a manufacture method for the semiconductor device.

A second object of the present invention is to provide a semiconductor device having an insulated gate field effect transistor in which source and drain regions are provided in a single crystal semiconductor layer formed on an insulating layer with a channel region interposed between said source and drain regions, wherein insulating layers just below said source and drain regions are made thicker than an insulating layer just below said channel region.

A third object of the present invention is to provide a semiconductor device wheren an insulating layer is selectively formed around a gate electrode on said channel region and the insulating film surface over said gate channel is flattened.

A fourth object of the present invention is to provide a semiconductor device wherein a single crystal semiconductor layer is formed on the flattened insulating layer surface under.

A fifth object of the present invention is to provide a manufacture method for a semiconductor device, said method comprising the steps of:

forming thick selective oxide films just below those regions on a first single crystal Si substrate which become source and drain regions, flattening said first single crystal Si substrate, and then forming an oxide film on the flattened substrate surface, bonding the surface of a non-porous single crystal layer of a second single crystal Si substrate changed into the porous structure or the surface of an oxide film formed on said non-porous single crystal layer, to the oxide film surface of said first single crystal Si substrate, removing said second single crystal Si substrate changed into the porous structure by treatment including at least wet chemical etching, and forming a single crystal semiconductor layer on said bonded oxide film, and forming source and drain regions on said thick selective oxide films.

A sixth object of the present invention is to provide a manufacture method for a semiconductor device, further comprising the steps of forming a gate electrode on said single crystal semiconductor layer, forming a selective oxide film in the region around said gate electrode, and flattening the formed selective oxide film and an oxide film on said gate electrode.

A seventh object of the present invention is to provide a manufacture method for a semiconductor device, further comprising the steps of bonding the selective oxide film and the oxide film on the gate electrode, which have been flattened, to the surface of a non-porous single crystal layer on a third single crystal Si substrate changed into the porous structure, or to an oxide film formed on said non-porous single crystal layer, and removing said third single crystal Si substrate changed into the porous structure by treatment including at least wet chemical etching, and forming a single crystal semiconductor layer on said bonded oxide film.

An eighth object of the present invention is to provide a semiconductor device having an NMOS transistor and a PMOS transistor, wherein active layers of both said transistors are each formed by a first single crystal semiconductor layer, second single crystal semiconductor layers are provided with insulating layers interposed between said active layers and said second single crystal semiconductor layers, and said second single crystal semiconductor layers are electrically separated between said NMOS transistor and said PMOS transistor, and also to provide a liquid crystal display wherein said semiconductor device is used in a peripheral driver circuit and said PMOS transistor is used as a switching device in a display section.

With the present invention, the insulating layers locating just below the source and drain regions are made thicker than the insulating layer locating just below the channel region, whereby a short channel effect is suppressed. Accordingly, there can be provided a semiconductor device which has a higher degree of density and integration, and which has reduced parasitic capacity and operates at a higher speed.

Also, by selectively forming the insulating layer in the region around the gate electrode on the channel region, a wiring pattern or the like can be formed after flattening the insulating layer surface on the gate electrode. Further, by forming a single crystal semiconductor layer on the insulating layer thus formed and flattened, a laminated semiconductor device can be obtained which has an insulated gate field effect transistor in the underlying layer.

DETAILED DESCRIPTION OF THE PREFERRED EMBODIMENTS

Prior to describing semiconductor devices according to preferred embodiments of the present invention, a description will first be given to a method of manufacturing a single crystal semiconductor thin film which is desirable to obtain those semiconductor devices, taking Si as an example.

A single crystal Si layer is formed by using a porous Si substrate which is obtained by changing a single crystal Si substrate into porous Si. A transmission electron-microscopic observation shows that the porous Si substrate has micro-pores of about 600 Å in mean diameter. Also, while the porous Si substrate has density less than a half that of the single crystal Si substrate, single crystallinity is still maintained and a single crystal Si layer can be formed on the porous layer through epitaxial growth. At a temperature not lower than 100° C., however, internal micro-pores are rearranged to impair a characteristic of enhanced etching. For this reason, a low-temperature method such as a molecular beam epitaxial growth process, plasma CVD process, thermal CVD process, optical CVD process, bias-sputtering process, crystal growth process, etc. is suitable for epitaxial growth of the Si layer.

A description will now be given of a method of effecting epitaxial growth of a single crystal layer after changing P-type Si into porous Si.

A single crystal Si substrate is prepared and then changed into porous Si by an anodization process using an HF solution. While single crystal Si has density of 2.33 g/cm$^3$, the density of porous Si can be varied in the range of 0.6 to 1.1 g/cm$^3$ when the content of the HF solution is varied between 20 and 50 weight %. The porous Si layer tends to be easily formed on a P-type Si substrate from the following reason.

Porous Si was discovered in the course of studies of electrolytic grinding of semiconductors. In a dissolving reaction of Si during anodization, holes are required for an anodic reaction of Si in an HF solution and the anodic reaction is expressed as follows;

$$SiF_4 + 2HF \rightarrow H_2SiF_6$$

or $$Si + 4HF + (4-\lambda)e^+ \rightarrow SiF_4 + 4H^+ + \lambda e^-$$

$$SiF_4 + 2HF \rightarrow H_2SiF_6$$

where $e^+$ and $e^-$ respectively represent a hole and an electron, and n and $\lambda$ each represent the number of holes necessary for one Si atom to dissolve. It is reported that porous Si is formed on condition of n>2 or $\lambda$>4.

This means that P-type Si including holes is more easy to change into porous Si.

It is, on the other hand, reported that high density N-type Si can also be changed into porous Si. Accordingly, single crystal Si can be changed into porous Si regardless of whether it is P-type or N-type.

Further, a porous layer has a great number of voids formed therein and its density is as small as half or below that of the non-porous structure. As a result, the porous structure has a much increased surface area per unit volume and, therefore, a porous layer exhibits a much greater chemical etching rate than an ordinary single crystal layer.

Porous Si is formed by anodization of single crystal Si under the following conditions. Note that the starting material of porous Si formed by anodization, however, is not limited to single crystal Si. Namely, it is possible to employ Si of other types of crystalline structures.

Voltage applied: 2.6 (V)

Current density: 30 (mA·cm$^{-2}$)

Anodizing solution: HF:H$_2$O:C$_2$H$_5$OH=1:1:1

Time: 2.4 (hours)

Thickness of porous Si: 300 ($\mu$m)

Porosity: 56 (%)

A single crystal Si thin film is formed through epitaxial growth on the porous Si substrate formed by the above anodization. A thickness of the single crystal Si thin film is preferably not larger than 50 $\mu$m, more preferably not larger than 20 $\mu$m.

Then, after oxidizing the surface of the single crystal Si thin film, a substrate which will become a substrate of the final device is prepared and the oxide film on the single crystal Si surface is bonded to the substrate. As an alternative, the surface of a single crystal Si substrate, newly prepared, is oxidized and then bonded to the single crystal Si layer on the porous Si substrate. The reason why the oxide film is provided between the substrate and the single crystal Si layer is below. In the case of using glass as a substrate, for instance, the interface level produced by the underlying interface of an Si active layer is lower for the glass interface than for the oxide film interface and, therefore, characteristics of an electronic device can be improved remarkably. As another alternative, it is also possible to etch away the porous Si substrate by selective etching later described, and bond only the remaining single crystal Si thin film to a new substrate. Just by contacting the single crystal Si thin film and the substrate room temperature after cleaning their surfaces, both the members adhere closely to each other by van der Waals' forces to such an extent that they cannot be easily separated. In addition, thereafter, both the members are completely bonded to each other by heat treatment under a nitrogen atmosphere at temperature in the range of 200 to 900° C., preferably 600 to 900° C.

Subsequently, an Si$_3$N$_4$ layer is deposited as an etching prevention layer all over the two substrates bonded to each other, followed by removing only the Si$_3$N$_4$ layer which is located on the surface of the porous Si substrate. Apiezon wax may be used instead of the Si$_3$N$_4$ layer. After that, the porous Si substrate is totally removed by etching or any other suitable means, thereby providing a semiconductor substrate with the thin film single crystal Si layer.

A description will now be given to a selective etching process for removing only the porous Si substrate by non-electrolytic, wet etching.

Preferable examples of an etchant, which has no etching action upon crystal Si but enables selective etching of porous Si alone, are hydrofluoric acid, buffered hydrofluoric acid such as ammonium fluoride (NH$_4$F) or hydrogen fluoride (HF), a mixture of hydrofluoric acid or buffered hydrofluoric acid added with an aqueous solution of hydrogen peroxide, a mixture of hydrofluoric acid or buffered hydrofluoric acid added with alcohol, and a mixture of hydrofluoric acid or buffered hydrofluoric acid added with an aqueous solution of hydrogen peroxide and alcohol. Etching is made by immersing the bonded substrates in any of those solutions for etching. An etching rate depends on the content and the temperature of hydrofluoric acid, buffered hydrofluoric acid, and the aqueous solution of hydrogen peroxide. By virtue of adding the aqueous solution of hydrogen peroxide, the oxidation of Si can be accelerated so as to realize a greater reaction speed than the case where hydrogen peroxide is not added. Additionally, the reaction speed is controllable by varying the content of the aqueous solution of hydrogen peroxide. Also, by virtue of adding alcohol, voids of etching reaction product gases can be instantaneously removed from the etched surface without requiring agitation of the etchant, so that porous Si can be uniformly and efficiently etched.

The HF content in the buffered hydrofluoric acid is set to be preferably in the range of 1 to 95 weight % for the etchant, more preferably 1 to 85 weight %, most preferably 1 to 70 weight %. The NH$_4$F content in the buffered hydrofluoric acid is set to be preferably in the range of 1 to 95 weight % for the etchant, more preferably 5 to 90 weight %, most preferably 5 to 80 weight %.

The HF content is set to be preferably in the range of 1 to 95 weight % for the etchant, more preferably 5 to 90 weight %, most preferably 5 to 80 weight %.

The H$_2$O$_2$ content is set to be preferably in the range of 1 to 95 weight % for the etchant, more preferably 5 to 90 weight %, most preferably 10 to 80 weight %, and also in the range where the effect of addition of hydrogen peroxide is maintained.

The alcohol content is set to be preferably not larger than 80 weight % for the etchant, more preferably not larger than 60 weight %, most preferably not larger than 40 weight %, and also in the range where the effect of addition of alcohol is maintained.

The temperature is set to be preferably in the range of 0 to 100° C., more preferably 5 to 80° C., most preferably 5 to 60° C.

Alcohol used in the present process can be any suitable alcohol, such as ethylalcohol and isopropyl alcohol, which does not cause any problem from the view point of practical production process and with which the effect of addition of alcohol is expected.

By making the single crystal Si thin film, obtained through the above process, subjected to ion implantation of O$_2$ or bonded to another Si wafer having an insulating film thereon, an insulating film can be obtained which has two single crystal Si thin films on both sides.

In the case of the ion implantation process, the Si film thickness prior to the implantation is preferably in the range of 1 to 5 μm depending on purpose. $O_2$ ions are implanted with density of $5 \times 10^{17}$ to $5 \times 10^{18}$ cm$^{-2}$ at acceleration energy of 200 KeV, followed by heat treatment for several hours at temperature in the range of 1100 to 1200° C. As a result, there can be formed single crystal Si of 2000 to 4000 Å on the outermost surface and an $SiO_2$ layer of 1000 to 5000 Å therebelow.

In the case of the bonding process, the insulating film is formed to be 500 to 10000 Å thick and, after bonding, Si on the outermost surface can be thinned to be 2000 Å to several μm thick by grinding. The former ion implantation process is preferably used in the present invention.

A manufacture method for a semiconductor device of the present invention is as follows. Thick selective oxide films are formed just below those regions on a first single crystal substrate which become source and drain regions, the first single crystal substrate is flattened, and then an oxide film is formed on the flattened substrate surface, thereby fabricating a first substrate in which thick oxide films are formed in those regions going to locate just below the source and drain regions, and a thin oxide film is formed in that region going to locate just below a channel region. On the other hand, a non-porous single crystal Si layer with good crystallinity is formed on a second single crystal Si substrate which has been changed into porous Si and has a high etching rate, or an insulating layer is further formed on the non-porous single crystal Si layer, thereby fabricating a second substrate. After bonding the first and second substrates to each other, the second single crystal Si substrate which has been changed into porous Si is removed by treatment including at least wet chemical etching. Thus, a thin single crystal Si layer with good crystallinity and uniform film thickness is formed on the bonded insulating layer by a simple process. The source and drain regions are formed on the thick selective oxide films.

Also, by forming a gate electrode on the above single crystal semiconductor layer, forming a selective oxide film in the region around the gate electrode, and flattening the formed selective oxide film and an oxide film on the gate electrode, a wiring pattern or the like can be formed on the flattened oxide film surface.

Further, by bonding the flattened selective oxide film and oxide film on the gate electrode to the surface of a non-porous single crystal layer on a third single crystal Si substrate which has been changed into porous Si, or to an oxide film formed on the non-porous single crystal layer, and removing the third single crystal Si substrate which has been changed into porous Si by treatment including at least wet chemical etching so as to form a single crystal Si on the bonded oxide film, a laminated semiconductor device can be obtained which has an insulated gate field effect transistor in the underlying layer.

In the case of forming a double gate MOS transistor as the semiconductor device of the present invention, a first gate is preferably formed to have a film thickness not smaller than 500 Å, more preferably not smaller than 2000 Å. If the film thickness is smaller than 500 Å, there would be a fear of undesirable increase in the gate resistance value. In a liquid crystal display of the present invention, a film thickness of the first gate is preferably in the range of 500 to 10000 Å, more preferably in the range of 2000 to 6000 Å. If the film thickness is not larger than 500 Å, there would be a fear of undesirable increase in the gate resistance value. On the other hand, if it is too thick, there would arise difficulties in making pixel portions completely transparent.

Additionally, the area ratio between first and second gates is not particularly limited in the present invention. Taking into account characteristics as a double gate device, however, when the first and second gates are used in one-to-one relation, the area ratio of second to first gate is preferably in the range of 1/1 to 10/1. If the first gate is too small or the second gate is too large, there would cause undesirable problems in connection and alignment between the first and second gates, etc., which would complicate the manufacture process and lead to the increased production cost. As shown in Embodiment 6 described later, it is also possible to make one second gate shared by all NMOS transistors and the other second gate shared by all PMOS transistors for controlling two groups of NMOS and PMOS transistors at the same time per group. In this case, the first and second gates are not connected and controlled independently of each other, and no particular limitations are imposed on the area ratio of second to first electrode.

(Embodiment 1)

Figure 2:
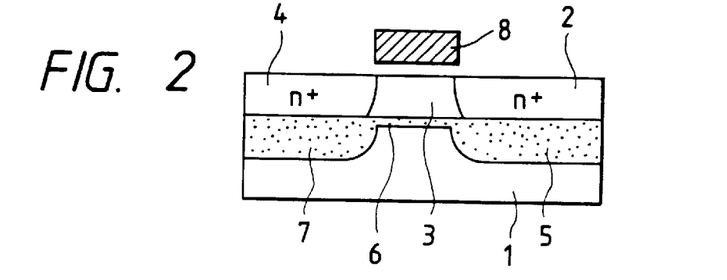
FIG. 2 is a sectional view for explaining the construction of an N-type MOS transistor according to a first embodiment of the present invention.

FIG. 2.is a sectional view for explaining the construction of an N-type MOS transistor according to a first embodiment of the present invention.

In FIG. 2, denoted by reference numeral 1 is a single crystal Si substrate, 2, 3, 4 are respectively a source region, a channel region and a drain region, 5, 6, 7 are oxide films just below the source region 2, the channel region 3 and the drain region 4, and 8 is a gate electrode. The oxide films 5, 7 are selective oxide films made flattened and are formed to have a larger thickness than the oxide film 6. In the MOS transistor having such a structure, since the oxide films 5, 7 are formed to be thick, parasitic capacity associated with the source and drain regions (i.e., parasitic capacity between the substrate and the source region and between the substrate and the drain region) can be suppressed. Further, since the oxide film 6 is formed to be thin, a short channel effect can also be suppressed.

It should be noted that while the LOCOS (Local Oxidation of Silicon) process is used to form the thick insulating layers just below the source and drain regions in this embodiment, the present invention is not limited to the use of the LOCOS process. Alternatively, it is also possible to etch bulk Si and then bury insulating layers of SiON or the like in place.

A description will now be given of the manufacture process for the N-type MOS transistor having the above-mentioned structure.

The manufacture method for the N-type MOS transistor having the above-mentioned structure comprises the steps of forming a single crystal Si layer on the flattened oxide films which are thick just below only the source and drain regions, and forming a MOS transistor on the single crystal Si layer. Thus, the method is practiced on the basis of an SOI technique adapted to form the single crystal Si layer on the flattened insulator surface. Although the N-type MOS transistor having the above-mentioned structure may be manufactured by using any of existing SOI techniques, for instance, a method of condensing and irradiating an energy beam such as a laser beam and growing a single crystal layer on $SiO_2$ by recrystallization through melt, the single crystal Si layer with uniform layer thickness and good crystallinity can be formed on the insulator surface by using the above-explained manufacture method with bonding.

FIGS. 3 to 9 are a series of Views showing successive steps for manufacture of the N-type MOS transistor according to this embodiment.

Figure 3:
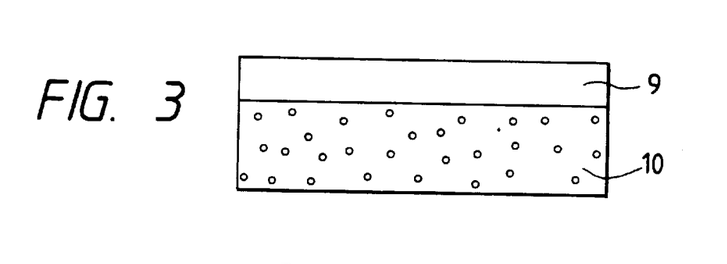
FIG. 3 is a view showing one of successive steps for manufacture of the N-type MOS transistor according to the first embodiment.

First, as shown in FIG. 3, a single crystal Si substrate is anodized under the following conditions to form a porous Si substrate 10:

Voltage applied: 2.6 (V)
Current density: 30 (mA·cm$^{-2}$)
Anodizing solution: HF:H$_2$O:C$_2$H$_5$OH=1:1:1
Porosity: 56 (%)

Then, a non-porous single crystal Si layer 9 is formed through epitaxial growth on the surface of the porous Si substrate. A thickness of the single crystal Si layer 9 was set to 0.1 μm in one experimental example. The epitaxial growth is performed by any of such usual methods as a thermal CVD process, reduced-pressure CVD process, plasma CVD process, molecular beam epitaxial process, and sputtering process.

Figure 4:
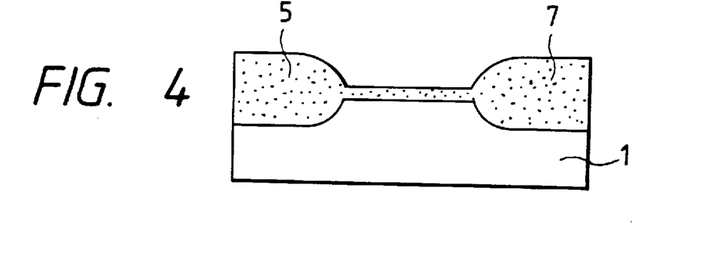
FIG. 4 is a view showing one of successive steps for manufacture of the N-type MOS transistor according to the first embodiment.
Figure 5:
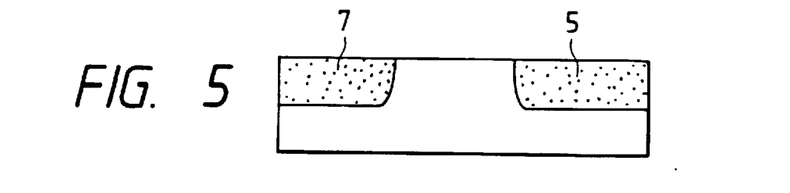
FIG. 5 is a view showing one of successive steps for manufacture of the N-type MOS transistor according to the first embodiment.
Figure 6:
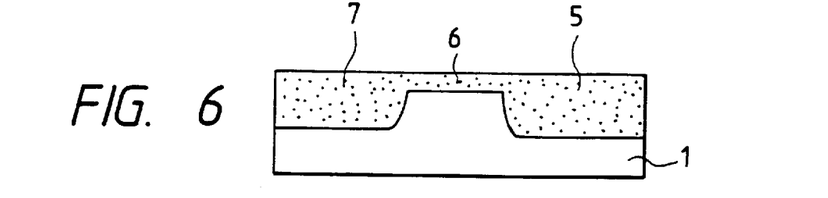
FIG. 6 is a view showing one of successive steps for manufacture of the N-type MOS transistor according to the first embodiment.

On the other hand, as shown in FIG. 4, the selective oxide films 5, 7 being as thick as about 1 μm are formed on the surface of the single crystal Si substrate in those regions which are to locate just below the source and drain regions. The selective oxide films 5, 7 can be formed by patterning an Si$_3$N$_4$ film on the surface of the single crystal Si substrate in the region which are to. locate just below the channel region with an oxide film interposed therebetween, and making it subjected to wet oxidation at 1000° C. Then, as shown in FIGS. 5 and 6, the Si$_3$N$_4$ film is removed and SOG (Spin On Glass) is coated on the surface, followed by flattening through reflow. After the flattening, SiO$_2$ is etched to form the flattened selective oxide films 5, 7. Subsequently, the surface is oxidized to form the oxide film 6 as thin as 200 Å.

Figure 7:
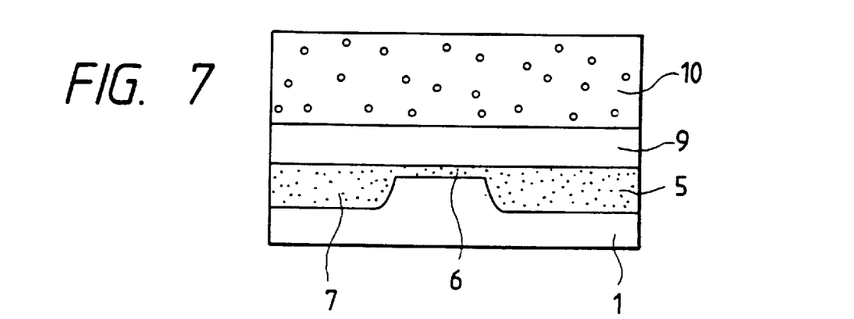
FIG. 7 is a view showing one of successive steps for manufacture of the N-type MOS transistor according to the first embodiment.

Next, as shown in FIG. 7, the single crystal Si substrate 1 having the selective oxide films 5, 7 and the oxide film 6 and the porous Si substrate 10 having the non-porous single crystal Si layer 9 are brought into close contact after cleaning, and then fixedly bonded to each other by being heated under an atmosphere of oxygen, nitrogen, hydrogen, rare gas or the like.

In the above, an oxide film may be formed on the single crystal Si layer 9. A certain interface level is possibly produced when fabricating a thin film device through the interface, but such an interface level can be reduced by forming the oxide film on the single crystal Si layer 9. Generally, the higher the temperature of the heat treatment, the stronger is bonding strength at the interface. This is attributable to that at the temperature not lower than about 200° C., both atoms of hydrogen and oxygen having been bonded to each other through the hydrogen bond are removed by dehydration in the form of H$_2$O and the condensed silanol bond (Si—O—Si) is left to be formed. While the dehydrated H$_2$O still remains near the interface in the form of voids or the like, the bonding strength does not yet reach the maximum level, and it is maximized when those voids are dispersed and vanished thoroughly. The bonding strength is saturated in that state and will no longer be intensified even by further increasing the temperature of the heat treatment. The temperature at which the bonding strength is saturated is about 1000° C. Therefore, the temperature of the heat treatment was set to about 1000° C. in one experimental example.

Figure 8:
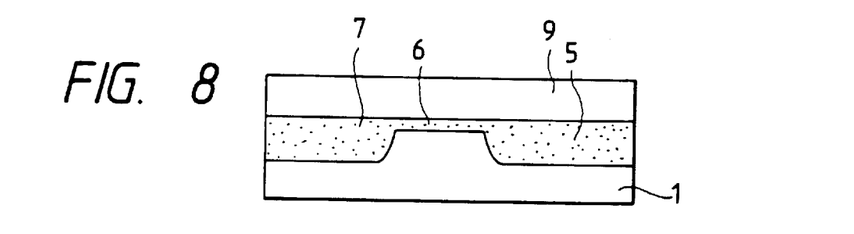
FIG. 8 is a view showing one of successive steps for manufacture of the N-type MOS transistor according to the first embodiment.

Then, as shown in FIG. 8, the porous Si substrate 10 is etched away by using an etchant below. An etchant which can selectively etch the porous Si substrate 10 alone without etching single crystal Si is given by a hydrofluoric acid-base etchant such as hydrofluoric acid and buffered hydrofluoric acid. By adding alcohol, such as methanol, ethanol, propanol and isopropanol, to the above etchant, voids of etching reaction product gases can be instantaneously removed from the etched surface without requiring agitation of the etched, so that porous Si can be uniformly and efficiently etched. Also, by adding an aqueous solution of hydrogen peroxide, the oxidation of Si can be accelerated so as to realize a greater reaction speed than the case where hydrogen peroxide is not added. Additionally, the reaction speed is controllable by varying the content of the aqueous solution of hydrogen peroxide.

In one experimental example, the porous Si substrate 10 was subjected to selective etching using a mixture solution of 49% hydrofluoric acid, alcohol and a 30% aqueous solution of hydrogen peroxide (10:6:50) without agitating the etchant. The porous Si subtrate 10 was selectively etched and removed completely. The single crystal Si layer formed on the oxide film in that way had a uniform layer thickness.

Figure 9:
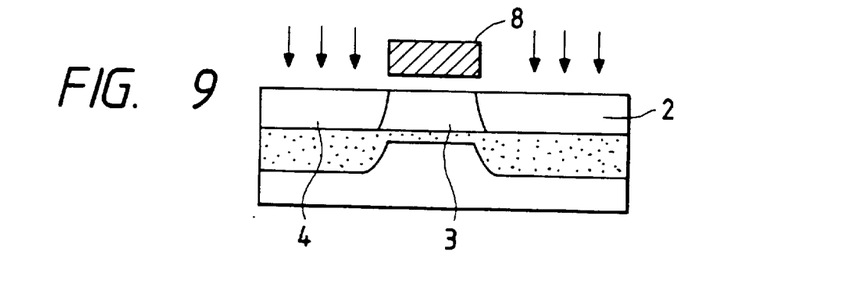
FIG. 9 is a view showing one of successive steps for manufacture of the N-type MOS transistor according to the first embodiment.

Thereafter, as shown in FIG. 9, the gate electrode 8 is formed through a gate insulating film. Then, impurity ions are implanted by using the gate electrode 8 as a mask and annealed to form the source and drain regions 2, 4. In the foregoing, the gate electrode 8 can be formed on the oxide film 6 with high accuracy by detecting the edges of the selective oxide films 5, 7 by an He—Ne laser from above and forming the gate electrode 8 with the detected edges being as reference. Alternatively, apart from the selective oxide films 5, 7, other selective oxide regions may be formed to serve as alignment marks.

Thus, the N-type MOS transistor shown in FIG. 2 is manufactured. According to this embodiment, a short channel effect can be suppressed by reducing the thickness of the single crystal Si layer and the thickness of the oxide film below the channel region. As a result, it is possible to manufacture a MOS transistor with a rule not larger than 1 μm.

(Embodiment 2)

Figure 10:
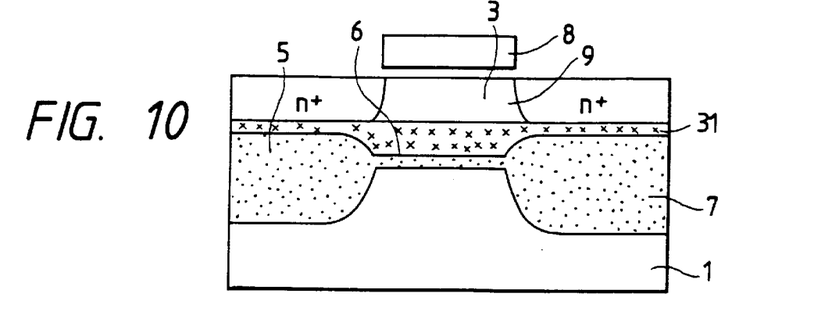
FIG. 10 is a sectional view for explaining the construction of an N-type MOS transistor according to a second embodiment of the present invention.

A description will now be given of a second embodiment of the present invention with reference to FIG. 10. This second embodiment is different from the above first embodiment in that the single crystal Si film is formed over the thick oxide films just below the source and drain regions and the thin oxide film just below the channel region with BPSG (Boron Phospharus Silicate Glass) 31 interposed therebetween. By adopting this structure, even when a difference in level is present between the LOCOS oxide films 5, 7 and the non-LOCOS oxide film-6, the interface between the single crystal Si layer 9 and those oxide films is surely flattened by virtue of the BPSG which has good reflow characteristics, with the result of good bonding characteristics. It should be noted that the intermediate layer may be formed of any other material than BPSG so long as it has superior reflow characteristics, and SOG or the like is also applicable.

(Embodiment 3)

This third embodiment is different from the first embodiment in that the upper side of the gate electrode in the N-type MOS transistor is flattened.

Figure 11:
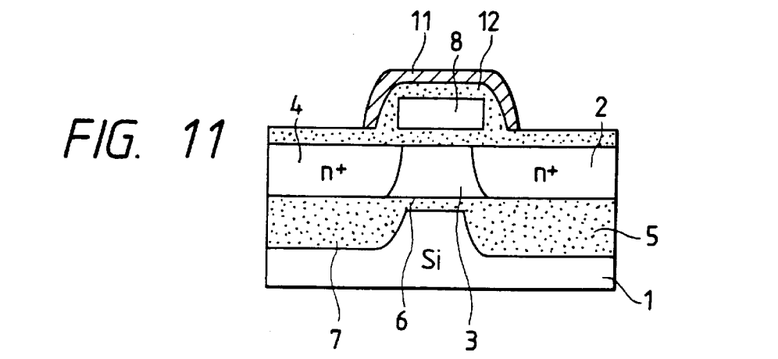
FIG. 11 is a view showing one of successive steps for manufacture of an N-type MOS transistor according to a third embodiment of the present invention.
Figure 12:
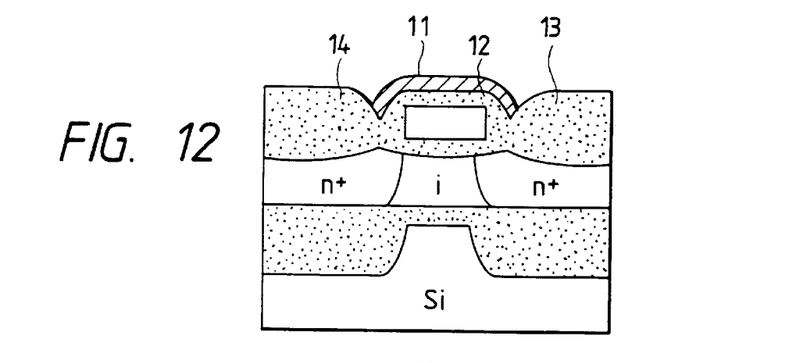
FIG. 12 is a view showing one of successive steps for manufacture of the N-type MOS transistor according to the third embodiment.
Figure 13:
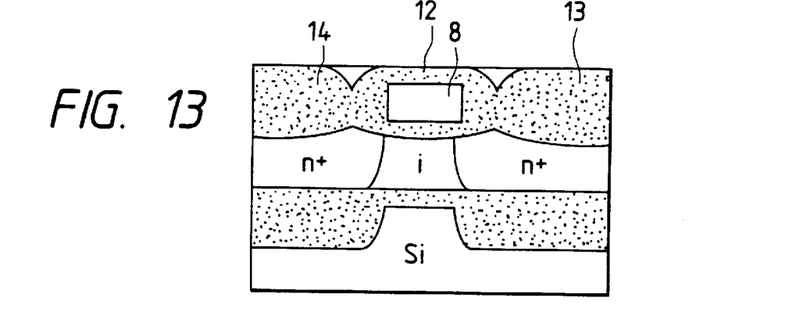
FIG. 13 is a view showing one of successive steps for manufacture of the N-type MOS transistor according to the third embodiment.

FIGS. 11 to 13 are a series of views showing successive steps for manufacture of an N-type MOS transistor according to this embodiment. Note that the same components as those shown in FIG. 2 are denoted by the same reference numerals.

After fabricating the N-type MOS transistor through the manufacture steps shown in FIGS. 3 to 9 similarly to the first embodiment, as shown in FIG. 11, an SiN film 11 is formed by selective etching cover the gate electrode 8 and its side walls with an oxide film 12 interposed therebetween. Such formation of the SiN film 11 can be made by using anisotropic dry etching.

Then, as shown in FIG. 12, selective oxide films 13, 14 are formed by wet oxidation. After that, as shown in FIG. 13, the SiN film 11 is removed and SOG is coated on the surface, followed by flattening through etch-back.

Flattening the surface so completely is effective in forming wiring patterns with a high degree of both density and integration.

(Embodiment 4)

This fourth embodiment is different from the first embodiment in that a P-type MOS transistor is further formed on the flattened oxide film surface to provide a laminated CMOS transistor.

Figures 14, 15A:
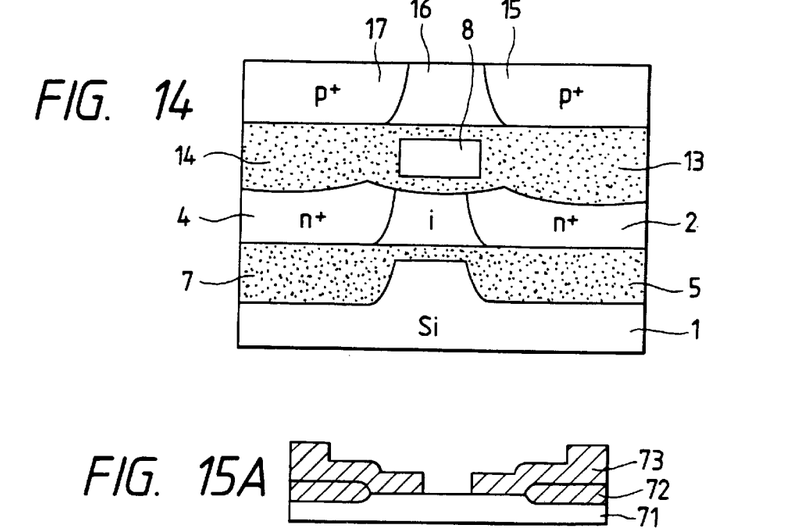
FIG. 14 is a sectional view for explaining the construction of a semiconductor device according to a fourth embodiment of the present invention.
FIGS. 15A to 15F are a series of views showing successive steps for manufacture of a double gate MOS FET.
Figure 15B:
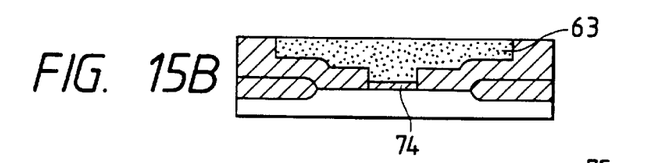
Figure 15C:
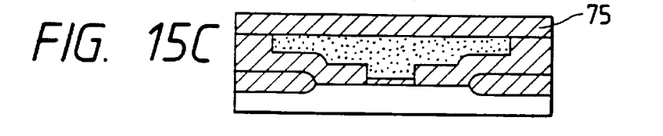
Figure 15D:
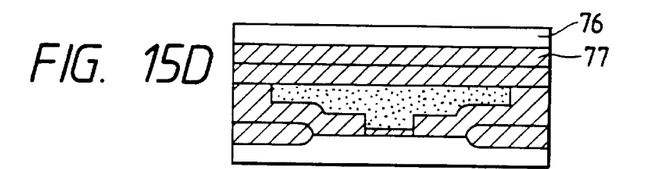
Figure 15E:
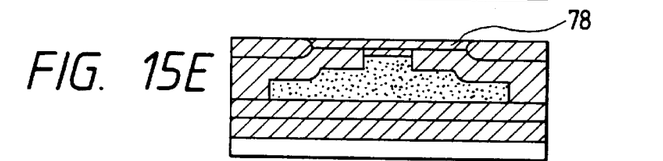
Figure 15F:
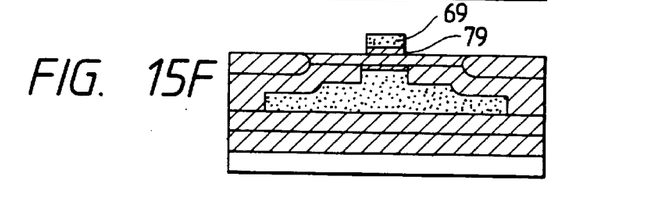

FIG. 14 is a sectional view showing such a laminated CMOS transistor according to this embodiment. Note that the same components as those shown in FIGS. 11 to 13 are denoted by the same reference numerals.

In this embodiment, as shown in FIG. 14, selective oxide films 13, 14 are formed in regions around the gate electrode 8 and flattened. Then, a single crystal Si layer is formed on the flattened oxide film surface, and a source region 15, a channel region 16 and a drain region 17 of a P-type MOS transistor are formed in the single crystal Si layer. Incidentally, the gate electrode 8 is shared by both the N-type MOS transistor and the P-type MOS transistor.

Manufacture steps of the laminated CMOS transistor having the above construction will be explained below. The following explanation is made with reference to FIGS. 13 and 3 to 8 because the manufacture steps in this embodiment are effected by bonding a porous Si substrate having a non-porous single crystal Si layer to the flattened oxide film surface in the third embodiment, to thereby form the single crystal Si layer on the oxide film surface, similarly to the first embodiment.

First, the porous Si substrate 10 having the non-porous single crystal Si layer on its surface as shown in FIG. 3 is bonded to the N-type MOS transistor having the flattened oxide film surface as shown in FIG. 13, thus resulting in the construction of FIG. 7. Then, as shown in FIG. 8, the porous Si substrate 10 is selectively etched away to form the single crystal Si layer on the flattened oxide film surface. The source and drain regions 15, 17 are formed in the single crystal Si layer by implanting impurity ions to form the P-type MOS transistor. In order to form the source and drain regions 15, 17 highly accurately with respect to the gate electrode 8, a method may be adopted which comprises the steps of forming selective oxide regions as alignment marks before the bonding, detecting the edges of the selective oxide films by an He—Ne laser from above, and implanting impurity ions with the detected edges being as references. It should be noted that conditions for changing into porous Si, conditions for the bonding, conditions for the etching of porous Si, etc. are the same as those explained above in Embodiment 1.

According to the first to fourth embodiments, as fully described above, the thickness of the insulating layer just below the channel region can be thinned without increasing the parasitic capacity associated with the source and drain regions, whereby a short channel effect can be prevented.

Also, by selectively forming an insulating layer in the region around the gate electrode over the channel region, it becomes possible to flatten the surface of the insulating film on the gate electrode and form a wiring pattern or the like on the flattened surface with a higher degree of both density and integration.

Further, by flattening the insulating film surface on the gate electrode and forming a single crystal semiconductor layer on the flattened insulating film surface, there can be obtained a laminated semiconductor device which has an insulated gate field effect transistor in the underlying layer.

One example of manufacture steps for a double gate MOS is shown in FIG. 15. First, a field $SiO_2$ film 72 and a CVD $SiO_2$ film 73 are formed on a single crystal Si 71 as a substrate, and then that portion which becomes a second gate is etched away (a). An insulating layer 74 which is to locate between first and second gates is formed in the etched portion by thermal oxidation. Next, polycrystal Si serving as the second gate is deposited as indicated by 63 and flattened to form a buried layer by grinding (b). An $SiO_2$ film is formed thereon by CVD to provide an insulating layer 75 of which surface is flattened by grinding (c). A support substrate 76 having a BPSG film 77 deposited thereon is bonded to the flattened surface by a heating bonding process based on vacuum electrostatic adsorption (d). The single crystal Si 71 is ground from the lower surface in (d) with the field $SiO_2$ film used as an etching stopper, to thereby form a single crystal Si thin film 78 serving as an active layer. After that, polycrystal Si is deposited over the single crystal Si thin film with an insulating layer 79 interposed therebetween, thereby forming the first gate. Subsequent steps are the same as manufacture steps for a usual MOS FET.

In this way, the manufacture steps for a double gate MOS transistor is complicated. Also, judging from the manufacture steps, the first and second gates are interconnected at a position spaced at least several $\mu m$ from the transistor. To fully utilize an effect of the double gate MOS transistor, the first and second gates are required to be controlled at the same time. From this viewpoint, the longer distance to the connection point between the first and second gates is disadvantageous. Additionally, an increase in the wiring patterns leads to not only a reduction in a degree of integration, but also a deterioration in characteristics of the transistor such as crosstalk between wiring leads and increased parasitic capacity associated with wiring leads, as well as a deterioration in operating speed of the circuit.

As a result of conducting intensive studies to solve the above problem, the inventors have accomplished semiconductor devices described in the following embodiments on the basis of such finding that a double gate MOS can be easily fabricated by forming, through ion implantation, an insulating layer in a single crystal semiconductor thin film which has been obtained by epitaxially growing a single crystal semiconductor on a porous substrate.

(Embodiment 5)

Figure 16:
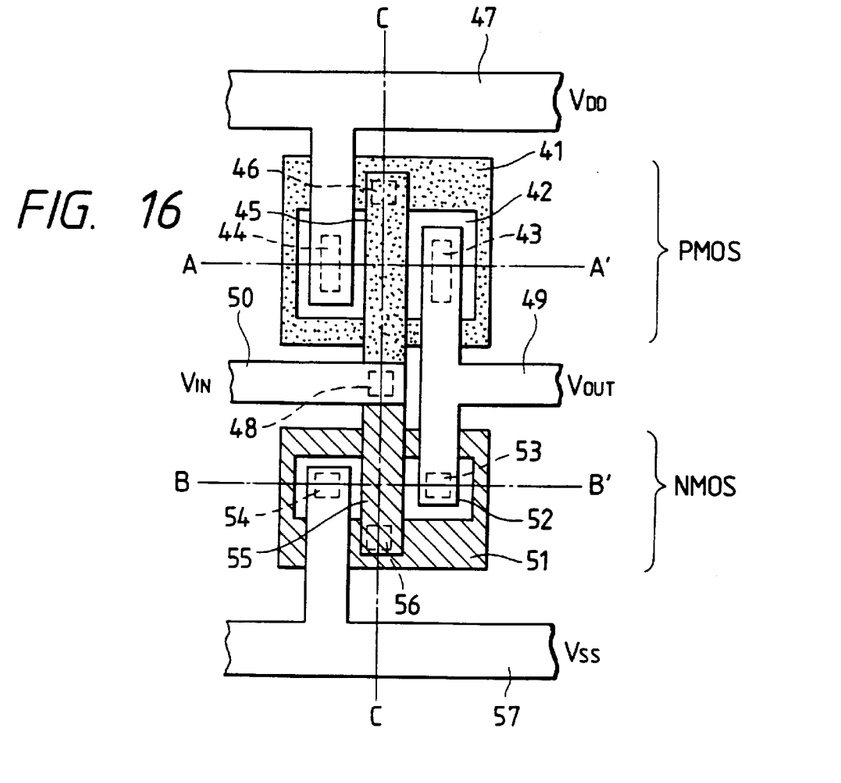
FIG. 16 is a top plan view showing an embodiment of an another semiconductor device of the present invention.

FIG. 16 shows a semiconductor device of this fifth embodiment as a schematic top plan view. Note that insulating layers are omitted from this figure. Sections taken along A—A', B—B' and C—C' in FIG. 16 are respectively shown in FIGS. 17A, 17B and 18.

This embodiment is directed to a double gate CMOS inverter in which respective second gates are formed in electrically separated relation below a PMOS transistor and an NMOS transistor correspondingly, and are connected at their ends to associated first gates.

Figure 17A:
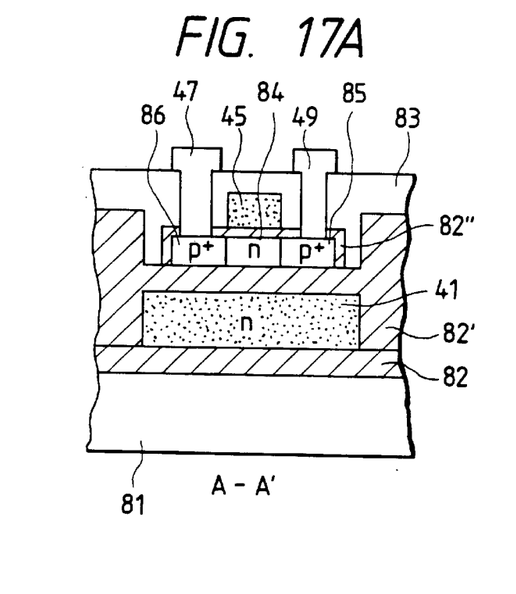
FIGS. 17A and 17B are sectional views of the semiconductor device shown in FIG. 16.
Figure 17B:
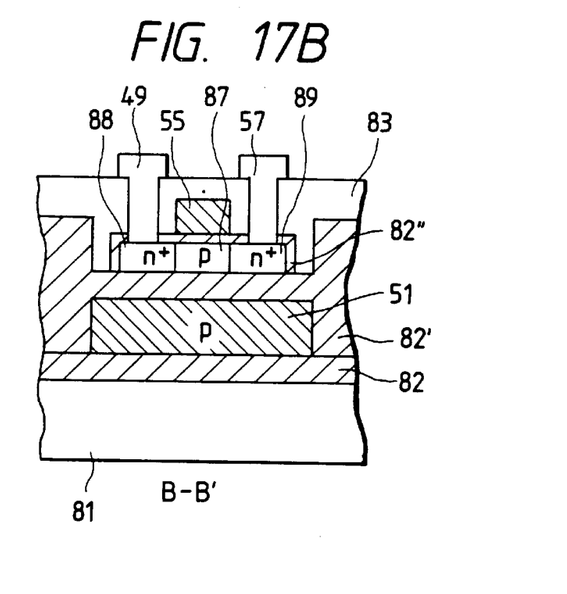
Figure 18:
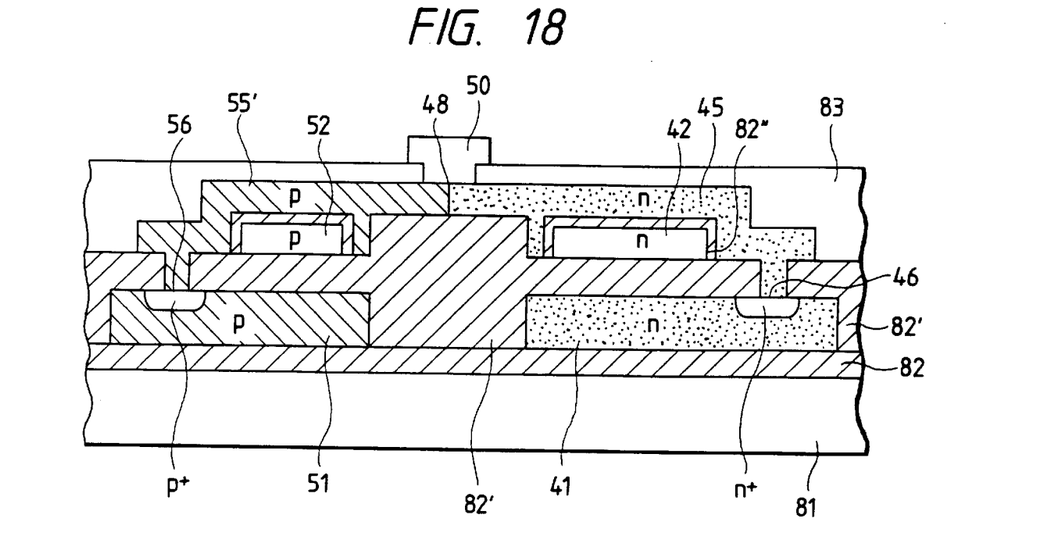
FIG. 18 is sectional view of the semiconductor device shown in FIG. 16.

In FIGS. 16 to 18, reference numerals 41 to 48 and 84 to 86 correspond to the PMOS transistor side. Specifically, denoted by 41 is a second gate, 42 is an active layer, 43 is a drain region contact for an output wiring lead, 44 is a source region contact for a power supply wiring lead on the higher voltage side, 45 is a first gate, 46 is a connecting portion between the first and second gates, and 47 is a power supply ($V_{DD}$) on the higher voltage side. In the active layer 42, there are formed an N-type channel region 84, a $P^+$-type drain region 85 and a $P^+$-type source region 86. On the other hand, reference numerals 51 to 57 and 87 to 89 correspond to the NMOS transistor side. Specifically, denoted by 51 is a second gate, 52 is an active layer, 53 is a drain region contact for an output wiring lead, 54 is a source region contact for a power supply wiring lead on the lower voltage side, 55 is a first gate, 56 is a connecting portion between the first and-second gates, and 57 is a power supply ($V_{SS}$) on the lower voltage side. In the active layer 52, there are formed a P-type channel region 87, an N⁺-type drain region 88 and an N⁺-type source region 89. The second gate on the PMOS transistor and the second gate on the NMOS transistor are doped to become the N-type and the P-type, respectively. Further, 48 is a connecting portion between the first gate 45 and the first gate 55, 49 is an output portion ($V_{OUT}$), 50 is an input portion ($V_{IN}$), 81 is an Si substrate, and 82 to 83 are insulating layers.

In an experimental example, the second gates 41, 51 and the active layers 42, 52 were each a single crystal Si thin film as explained above, and a single crystal Si thin film between both the transistors was changed to an insulating layer by using the LOCOS process to cover it with $SiO_2$ or by etching away a needless single crystal Si thin film and then forming an insulating layer newly in the etched area. Additionally, at the same time as implanting ions into the second gates, Si was also adopted into other portions.

Figure 19A:
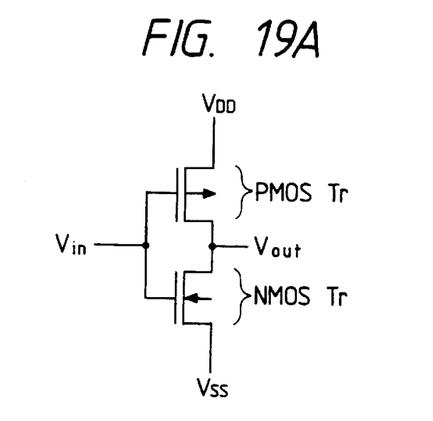
FIGS. 19A and 19B are equivalent circuits of the embodiments of the present invention.

An equivalent circuit of the CMOS inverter of this embodiment is shown in FIG. 19A.

This embodiment can provide excellent advantages below. Manufacture steps are very simple and the CMOS inverter can be manufactured at much lower cost than conventional. Also, as will be apparent from FIG. 18, since the connecting portions 46, 56 between the first and second gates are located close to the transistors, wiring leads more than enough are hardly present and the first and second gates can be controlled simultaneously in a satisfactory manner. Although the first and second gates may be interconnected in other form than illustrated in this embodiment, it is desirable to essentially eliminate those wiring leads which are required for the interconnection, as with this embodiment.

(Embodiment 6)

Figure 20:
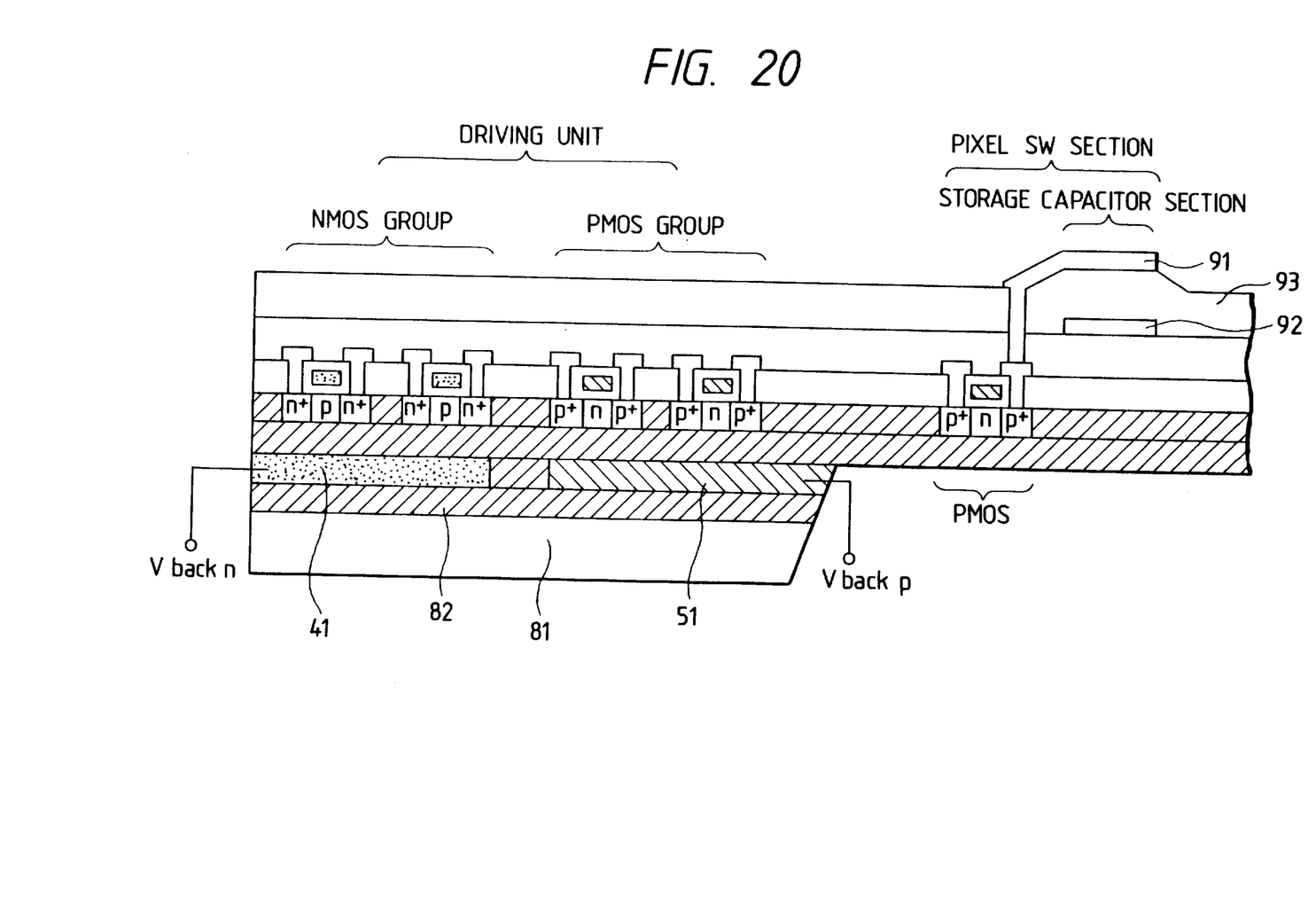
FIG. 20 is a sectional view of primary parts of an embodiment of a liquid crystal display according to the present invention.

FIG. 20 schematically shows, in section, primary parts of a liquid crystal display according to this sixth embodiment of the present invention. The same components as those in Embodiment 5 will not be described again and denoted by the same reference numerals. In this embodiment, an NMOS transistor group and a PMOS transistor group are provided with the second gates 41, 51, respectively, and controlled by using separate potentials $V_{backn}$, $V_{backp}$. The role of $V_{backn}$, $V_{backp}$ in this embodiment is as follows.

Specifically $V_{backn}$, $V_{backp}$ are controlled so as to prevent operation of a parasitic NMOS transistor in which $V_{backn}$ serves as a gate electrode and an underlying insulating film 82 serves as a gate insulating film, and to prevent operation of a parasitic PMOS transistor in which $V_{backp}$ serves as a gate electrode and an underlying insulating film 82 serves as a gate insulating film. When the underlying insulating film is formed by ion implantation, its thickness is about 5000 Å at maximum. On the other hand, to obtain a high-quality image in a liquid crystal display on the scale of more than several ten thousands pixels, $V_{DD}-V_{SS}>10$ V or more is required as a power supply voltage of the inverter shown in FIG. 19A. In a conventional inverter, because the $V_{backp}$ region 11 and the $V_{backn}$ region 41 are at the same potential, it has been difficult to find such conditions as able to prevent operation of both the parasitic NMOS transistor and the parasitic PMOS transistor. With the construction of this embodiment, by setting $V_{backn}=V_{SS}$ and $V_{backp}=V_{DD}$, for instance, there can be surely obtained conditions under which operation of both the parasitic MOS transistors is prevented completely.

Switching devices in a display section each comprise a PMOS transistor, an ITO (Indium Tin Oxide) connected to a drain region of the PMOS transistor provides a first ITO layer 91 serving as a pixel electrode, and further a second ITO layer 92 is provided as a storage capacitor with an insulating layer 93 interposed between the first and second ITO layers.

The Si substrate under the display section is etched away to give transparency for viewing. The etched vacant portion may be filled with a light transmissive filler for structural reinforcement.

The liquid crystal display of this embodiment is practically fabricated by further forming an insulating layer and an orientation control film over the substrate shown in FIG. 20, arranging one substrate thus completed in opposite relation to the other substrate on which a transparent electrode, an insulating film and an orientation control film are formed, with a spacer interposed therebetween, and placing a liquid crystal in a sealed manner.

Figure 19B:
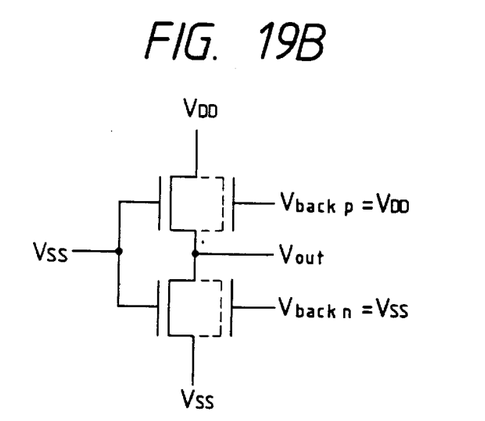

FIG. 19B shows an equivalent circuit of a peripheral driver circuit in this embodiment.

With this embodiment, MOS FETs used in the peripheral driver circuit have superior driving characteristics and are simply manufacture. Accordingly, it is possible to improve driving characteristics of the present liquid crystal display and reduce its production cost.

As fully described above, the semiconductor device of the present invention has superior performance and high reliability because it is more simply manufactured than conventional and is free from a fear of reduction in characteristics caused by connection wiring leads. In the liquid crystal display of the present invention in which the present semiconductor device is employed in a peripheral driver circuit, it is possible not only to cut down the production cost, but also to drive the display at a higher power supply voltage than conventional and to increase the degree of freedom in voltage setting, making studies for higher image quality easily made from the viewpoint of circuit arrangement. For instance, a voltage margin necessary for obtaining display with finer gradations is enlarged and, therefore, an allowable maximum value of parasitic capacity in the pixel section is also increased. Also, the timings in driving of circuits and so forth required for the higher image quality can be combined in various manners. This means that the present semiconductor device has essential conditions for realizing a finer, high-quality display in future. Furthermore, the liquid crystal display of the present invention in which the present semiconductor device is employed in a peripheral driver circuit makes it possible, in addition to cut down of the production cost, to speed up the driver circuit and improve its driving characteristics by utilizing the peripheral driver circuit with superior characteristics.

What is claimed is:

1. A method of manufacturing a semiconductor device having an insulated gate field effect transistor, said method comprising the steps of:

a) forming thicker selective oxide films just below those regions than the thickness of an insulating layer just below a channel region on a first substrate which become source and drain regions, flattening said first substrate, and then forming an oxide film on the flattened substrate surface, b) forming a non-porous single crystal semiconductor layer on a porous layer of a second substrate, c) bonding the surface of said non-porous single layer of the second substrate or the surface of an oxide film formed on said non-porous single crystal layer of the second substrate to the oxide film surface of said first substrate, d) removing said porous layer by treatment including at least wet chemical etching,
e) forming, in the single crystal semiconductor layer, source and drain regions on said thick selective oxide films,
f) forming a gate electrode on said single crystal semiconductor layer,
g) forming a selective oxide film in the region around said gate electrode, and
h) flattening the formed selective oxide film and an oxide film on said gate electrode.

2. A method according to claim 1, further comprising the steps of bonding the selective oxide film and the oxide film on the gate electrode, which have been flattened in said manufacturing method for the insulated gate field effect transistor, to the surface of a non-porous single crystal layer on a third substrate changed into the porous structure, or to an oxide film formed on said non-porous single crystal layer, and removing said third substrate changed into the porous structure by treatment including at least wet chemical etching, and forming a single crystal semiconductor layer on said bonded oxide film.

* * * * *

UNITED STATES PATENT AND TRADEMARK OFFICE
CERTIFICATE OF CORRECTION

PATENT NO.    : 6,096,582
DATED         : August 1, 2000
INVENTOR(S)   : SHUNSUKE INOUE ET AL.

*It is certified that error appears in the above-identified patent and that said Letters Patent is hereby corrected as shown below:*

ON THE TITLE PAGE:

[56] References Cited, under FOREIGN PATENT DOCUMENTS

"3108776" should read --3-108776--.

COLUMN 4:

Line 64, "follows;" should read --follows:--.

COLUMN 5:

Lines 41-67, close up left margin.

COLUMN 8:

Line 62, "Views" should read --views--.

COLUMN 9:

Line 19, "to." should read --to--.

COLUMN 12:

Line 6, "second." should read --second--.

COLUMN 14:

Line 21, "manufacture." should read --manufactured.--.

UNITED STATES PATENT AND TRADEMARK OFFICE
CERTIFICATE OF CORRECTION

PATENT NO.  : 6,096,582
DATED       : August 1, 2000
INVENTOR(S) : SHUNSUKE INOUE ET AL.

Page 2 of 2

It is certified that error appears in the above-identified patent and that said Letters Patent is hereby corrected as shown below:

<u>COLUMN 16</u>:

Lines 8-10, close up left margin.

Signed and Sealed this

Twenty-second Day of May, 2001

Attest:

NICHOLAS P. GODICI

Attesting Officer

Acting Director of the United States Patent and Trademark Office